United States Patent [19]

Ito et al.

[11] 4,297,610

[45] Oct. 27, 1981

[54] SMALL PIEZOELECTRIC TUNING FORK

[76] Inventors: Kunimoto Ito, 37-9, 1-chome, Kikunodai, Chofu-shi, Tokyo; Tsutomu Kakizawa, 23-17, 2 chome, Miyasaka, Setagaya-ku, Tokyo; Kengo Yonetani, 23-17, 2 chome, Miyasaka, Setagaya-ku, Tokyo, Japan; Hiroshi Nariai, 23-17, 2-chome, Miyasaka, Setagaya-ku, Tokyo, all of Japan

[21] Appl. No.: 830,964

[22] Filed: Sep. 6, 1977

Related U.S. Application Data

[63] Continuation-in-part of Ser. No. 709,067, Jul. 27, 1976, abandoned, which is a continuation of Ser. No. 546,042, Jan. 31, 1975, abandoned.

[30] Foreign Application Priority Data

Feb. 4, 1974 [JP] Japan ................................. 49-14354
Jan. 17, 1975 [JP] Japan ................................. 50-7023

[51] Int. Cl.³ .......................................... H01L 41/08
[52] U.S. Cl. ..................................... 310/370; 310/348
[58] Field of Search ............................... 310/370, 348

[56] References Cited

U.S. PATENT DOCUMENTS

| | | | |
|---|---|---|---|
| 3,131,320 | 4/1964 | Shinada et al. | 310/370 |
| 4,035,673 | 7/1977 | Ishida et al. | 310/370 X |

FOREIGN PATENT DOCUMENTS

| | | | |
|---|---|---|---|
| 2558129 | 12/1975 | Fed. Rep. of Germany | 310/270 |
| 2701294 | 1/1976 | Fed. Rep. of Germany | 310/370 |
| 7521163 | 4/1975 | France | 310/370 |

*Primary Examiner*—Mark O. Budd
*Attorney, Agent, or Firm*—William A. Drucker

[57] ABSTRACT

A tuning fork-type quartz vibrator having leg members of a length of below six millimeters and a thickness/width ratio below one reveals the zero temperature coefficient at temperatures appearing within a wrist watch carried by a human body. The vibrator also has a favorable low series resonant impedance.

1 Claim, 6 Drawing Figures

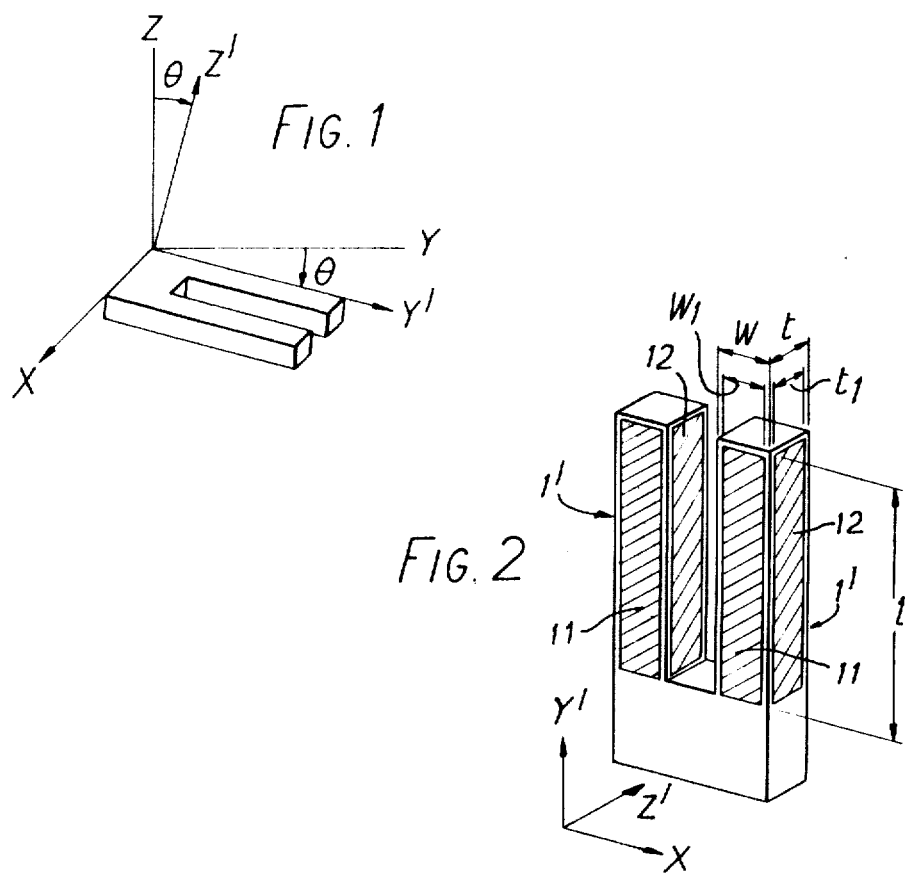
FIG. 1
FIG. 2
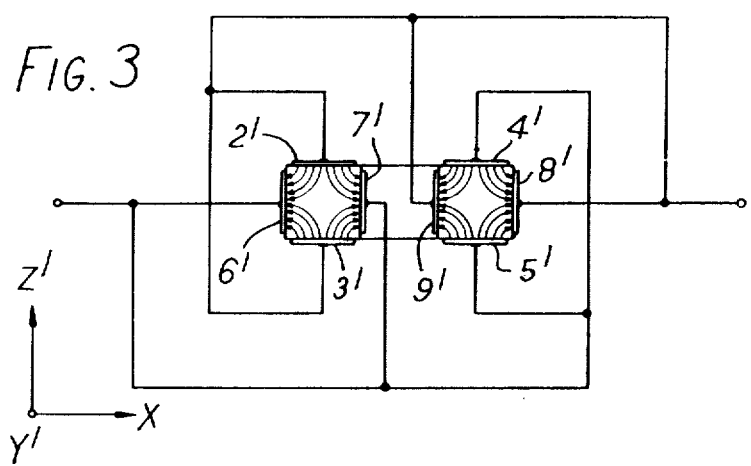
FIG. 3

SMALL PIEZOELECTRIC TUNING FORK

This is a Continuation-in-part application of our copending U.S. Pat. application Ser. No. 709,067 filed July 27, 1976 now abandoned, which was itself a Continuation of our U.S. Pat. application Ser. No. 546,042 filed Jan. 31, 1975, now abandoned.

BACKGROUND OF THE INVENTION

The present invention relates to piezoelectric vibrators which are vibrated in flection modes, and more particularly to such vibrators having the shape of a tuning fork, and used advantageously in small-sized watches.

OBJECTS OF THE INVENTION

It is an object of the present invention to provide means for minimizing dimensions of piezoelectric vibrators to be incorporated in watches.

It is another and more specific object of the present invention to provide means for effecting setting of the point of zero-temperature coefficient of piezoelectric vibrators at temperatures as high as a piezoelectric vibrator can be operated and having a good frequency-temperature characteristic in watches carried on the human body.

It is still another object of the present invention to provide means for simultaneously minimizing the dimensions of a piezoelectric vibrator and lowering the series resonant impedance of said vibrator.

Further objects and merits will become apparent from the following description taken in connection with the accompanying drawings.

BRIEF DESCRIPTION OF THE DRAWINGS

FIG. 1 is a perspective view of a tuning fork-type piezoelectric quartz vibrator body showing the relation between the axes of a quartz crystal and said vibrator body;

FIG. 2 is a perspective view of a tuning fork-type piezoelectric quartz vibrator having electrodes formed thereon;

FIG. 3 is a plan view of the piezoelectric quartz vibrator shown in FIG. 2 provided with electric connections, said vibrator being operated in a flection mode;

DESCRIPTION OF THE PREFERRED EMBODIMENTS

Figure 4A:
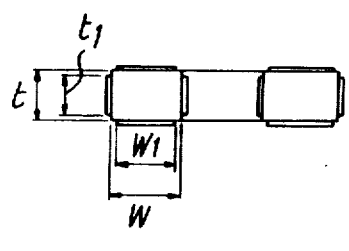
FIG. 4(a) is a plan view of an embodiment of the present invention.
Figure 4B:
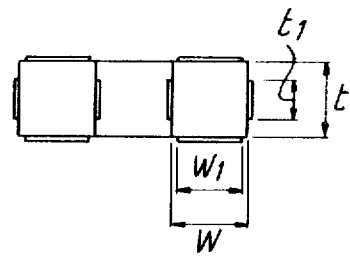
FIG. 4(b) is a plan view of another embodiment of the present invention.

In a low frequency piezoelectric vibrator, the flection vibration mode is used for preference, because a piezoelectric vibrator operated in such a mode is advantageous in dimensions. Also, it is formed in the shape of a tuning fork because a piezoelectric vibrator formed in such a shape is quite advantageous in that it can readily be secured firmly without vibration of the same being substantially affected.

Referring now to FIGS. 1 and 2, in a design of a tuning fork-type quartz vibrator angle $\theta$ of a quartz crystal, which is a pivoting angle of the Y and Z co-ordinate axes of said quartz crystal, is cut on the X-axis thereof so as to form new Y' and Z' co-ordinate axes, said Y'-axis being contained in a principal face of the vibrator body. The ratio l/w, where l is the length of a leg member of the vibrator body along said Y'-axis, and w is the width of each said leg member along the X-axis, is predetermined so that said vibrator body may have an optimum frequency-temperature characteristic in a temperature range used. Since a piezoelectric quartz flection vibrator has a frequency-temperature characteristic of the second order, it is favourable if the point of zero-temperature coefficient, that is the point at which the temperature coefficient, which is the differential value with respect to temperature of the frequency-temperature characteristic curve is zero, is so selected that it is positioned at around the middle of the temperature range used.

The temperature $T_o$ corresponding to said point of zero-temperature coefficient can be changed by changing said cut angle $\theta$, and said temperature $T_o$ can be changed fairly well in a lower temperature range. However, in a temperature range over 20° C., an increase in said temperature $T_o$ is so limited that it is very difficult to set said temperature $T_o$, for example at 27° C., which value of temperature is most desirable when a tuning fork-type quartz vibrator is to be incorporated in a wrist watch.

As far as has been previously known in a tuning fork-type quartz flection vibrator, a vibrator body having a plane of flection in a XY'-plane rotated clockwise by 5 degrees starting from the XY-plane has the length of said vibrator body extended in the direction parallel to said Y'-axis as much as possible in order that it may have said temperature $T_o$ as high as possible.

The highest value of temperature corresponding to said point of zero-temperature coefficient may be varied in accordance with said ratio w/l and the vibration frequency of said vibrator body.

For better understanding of the invention, an example of said tuning fork-type quartz flection vibrator as most commonly used in wrist watches and vibrated at 32 kilohertz will be given hereunder. Assuming that the length l of a leg member of the vibrator body extending from the base portion connecting the two leg members together is 4 mm, the width w of said leg member in the direction parallel to said flection plane and perpendicular to said length l is 0.72 mm, and said cut angle $\theta$ is 5 degrees, the temperature corresponding to said point of zero-temperature coefficient is 25° C., which value of temperature is the highest obtainable under the variation of said cut angle of a quartz crystal. That is, only a value of temperature below 25° C. can be obtained with a cut angle of the quartz crystal other than 5 degrees. On the other hand, it is known that said temperature $T_o$ can be varied according to said ratio w/l with a cut angle $\theta$. An increase in value of said ratio w/l would result in an increase in value of said temperature $T_o$.

But, in a flection vibrator vibrated at a frequency f, there is already known an approximate relation, $$f = k\, w/l^2$$

between said frequency f, said width w and said length l, where k is a constant. It is obvious from the above equation that the larger the value of said ratio w/l, the larger are the absolute values of said l and said w required for such vibrator to be vibrated at a determined frequency f.

Accordingly, in the foregoing example, the vibrator body would be increased in its dimensions so that said temperature $T_o$ can be set at a temperature over 25° C. This would result in an impossibility of designing a small-sized vibrator, particularly for use for wrist watches.

Referring now to FIGS. 2 and 3, in the design of tuning fork-type flection quartz vibrators having leg members extending in the direction of said Y'-axis, as mentioned in the foregoing, it is required to make the plane of flection lying in said XY'-plane so that said point of zero-temperature coefficient can be set at a temperature as high as possible. To make a quartz vibrator body vibrated in such a plane, pairs of electrodes 2' and 3', 4' and 5', 6' and 7', and 8' and 9' are formed on said leg members. An electrode in each said pair of electrodes stands opposite to the other. Each electrode in each said pair of electrodes is positioned on a Z'-plane which is perpendicular to said Z'-axis and forms a principal plane 11 of the body or on a X-plane which is perpendicular to said X-axis and forms a side face 12 of said leg member of the body.

Thus, by means of electric connections such as shown in FIG. 3, expansion and contraction of portions of said vibrator body located respectively at $+X$ side and $-X$ side, seen from the center, of said vibrator body can be caused contrary to each other by $+X$ and $-X$ components of electric fields which are formed by an alternating current supplied through said electric connections.

The role of the thickness t of the vibrator body in the direction of the Z'-axis which may affect the action of said vibrator body has not been clarified in the theory of vibration of such vibrator bodies. So, said thickness t has been treated as having no relation to the design of such vibrator bodies. Accordingly, in a design of a tuning fork-type vibrator, the cross section of a leg member of said vibrator body has been determined to be square or nearly square on the basis of equality in areas of electrodes and distribution of electric fields impressed on and between said electrodes.

On the other hand, a tuning fork-type flection mode quartz vibrator having leg members each having less than 6 mm length has not heretofore been known. One reason for this is that, to make the thickness/width ratio one with respect to each leg member, as noted above, is the standard design for vibrators to be used for wrist watches, and it has been well known that to make the leg member's length less than 7 mm in such standard design would cause an unfavourably high value of the series resonant impedance. Another reason is that, it has never heretofore been known that, to make the thickness/width ratio less than one in such a vibrator body having the leg member's length below 6 mm would cause a favourable effect on the optimization of the temperature of zero temperature coefficient in letting the series resonant impedance be kept at a low value. In fact, such a vibrator body having the thickness/width ratio below one has heretofore been known. However, it is merely for the object of effecting decrease in weight of the vibrator body with respect to large-sized vibrators which cannot be used for wrist watches.

We have noted in a tuning fork-type quartz vibrator operated in a flection mode, that by making said widths t of the leg members of the body smaller than the widths w of said leg members, said point of zero-temperature coefficient can be changed to a point corresponding to a temperature higher than that of such a vibrator body having said widths t equal to said widths w.

Hereunder will be stated more fully the effects and advantages of the present invention by reference to some embodiments of the present invention as compared with a conventionally designed tuning fork-type flection vibrator.

Figure 5:
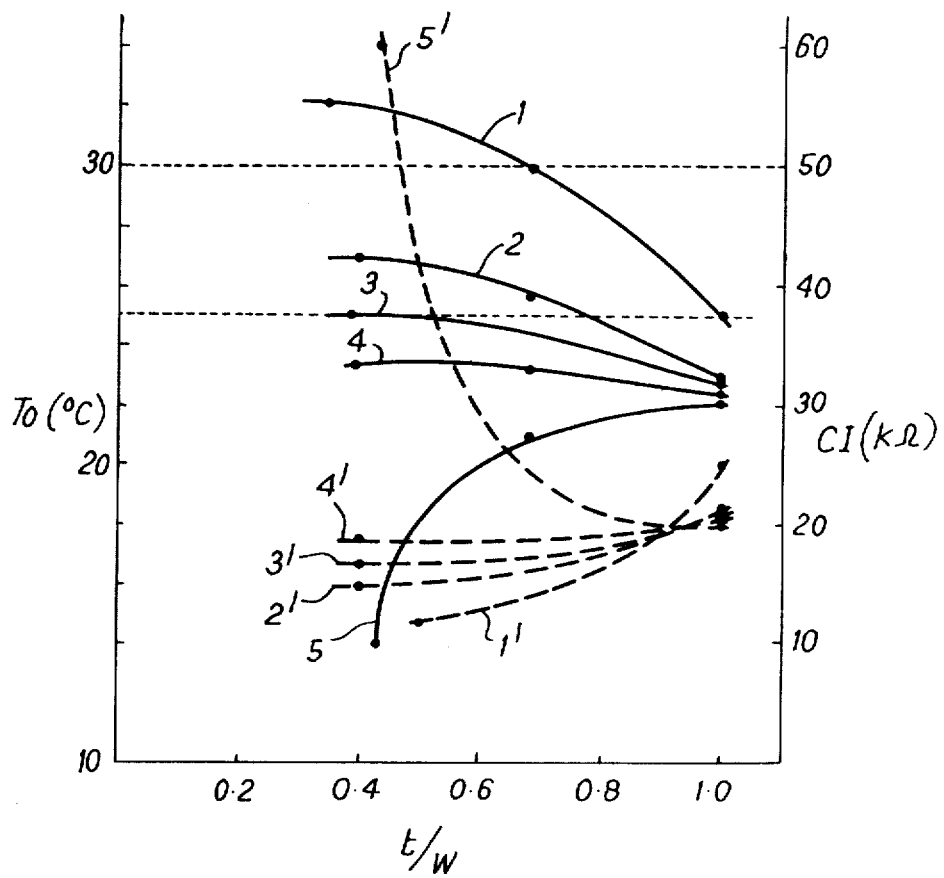
FIG. 5 is a graphic diagram showing the relationship between values of t/w against $T_o$, and CI where the length of the leg member is taken for the parameter.

A vibrator body as shown in FIGS. 2 and 3, in which $\theta = +5$ degrees, $l = 4$ mm, $w = t = 0.72$ mm ($t/w = 1$), provided with pairs of electrodes 2' and 3', and 4' and 5' on the principal faces 11 on each leg member 1' and other pairs of electrodes 6' and 7', and 8' and 9' on the side faces of said leg members was operated at 32 kilohertz. This is a conventional design of a tuning fork-type quartz vibrator except for the length l. A temperature $T_o$ which corresponds to the point of zero-temperature coefficient was 25° C. In this vibrator body, said width t was varied to 0.5 mm (t/w=0.65) and 0.25 (t/w=0.35). Such variation in the widths t gave said temperature $T_o = 30°$ C. and $T_o = 32°$ C. respectively as shown by curve 1 in FIG. 5. Moreover, with respect to the series resonant impedance CI of the vibrator body, as seen from curve 1' in FIG. 5, it was improved to 12 kilohms at t=0.5 mm against 25 kilohms at t=0.72 mm. No variations in frequency characteristics was observed in such variation in the widths t. In FIG. 5, solid curved lines 1, 2, 3, 4 and 5 show characteristics of $T_o$ against t/W of the vibrators having the leg member's length of 4 mm, 5 mm, 5.5 mm, 6 mm, and 6.58 mm respectively, and dotted curved lines 1', 2', 3', 4' and 5' show characteristics of CI against t/W respectively of the above-mentioned vibrators. And, it can be seen from the characteristic curves shown in FIG. 5 in accordance with this invention that, by selecting the leg member's length less than 6 mm and by determining the ratio t/W below one, $T_o$ can be optimized with respect to a tuning fork-type quartz vibrator to be used for wrist watches by letting CI be kept at a value which is sufficiently low for the powerful operation of said wrist watches.

In our other experiments, the dimensions $t_1$ of the electrodes 6', 7', 8', and 9' in the direction of the Z'-axis was varied under the condition in which said width t of the body was left unchanged. Such variations in dimensions of electrodes gave results similar to a characteristic curve as shown in FIG. 5.

It will readily be seen from the above that by making the cross sections of the leg members of the vibrator body in a flat rectangular form with respect to a tuning fork-type quartz vibrator, or by making the widths $t_1$ of the electrodes provided on the side faces of said leg members smaller than the widths $w_1$ of the electrodes provided on the principal faces of said leg members, the temperature $T_o$ corresponding to the point of zero-temperature coefficient can be changed to a higher value, so that the temperature $T_o$ can be optimized with respect to a piezoelectric vibrator to be incorporated in a wrist watch. Also, if said temperature $T_o$ be kept unchanged, the ratio of width w to length l of the leg members of the vibrator body can be made smaller which will permit vibrator bodies to be smaller in their entire dimensions. Further, in accordance with the present invention, because the quartz plate of said vibrator body can be formed thinner whilst the frequency characteristic of said vibrator body is kept unchanged, and because an improvement in the series resonant impedance is attained by making said body thinner, not only an increase in yield rate of said vibrator bodies but a decrease in weight of said bodies, which will result in the improvement in anti-shock character of said bodies, can be attained.

Whilst the present invention has been described in the foregoing stated with reference to quartz vibrators, it goes without saying that in a piezoelectric vibrator body other than of quartz crystal, similar results as stated in the foregoing can be obtained.

We claim:

1. A piezoelectric flection vibrator which comprises a tuning fork-type quartz vibrator body having a pair of leg members extending from the base portion of said vibrator body, the lengths of said leg members being equal to each other, said base portion of said vibrator body and said leg members including a pair of generally U-shaped principal faces positioned in parallel to each other, each said leg member having a pair of side faces each extending between and connecting said principal faces perpendicularly to each other, each said side face and each face on said leg members included in a said principal face of the vibrator body being provided with an electrode formed thereon, characterized in that said length of said leg member is less than six millimeters and the ratio t/w where t and w are the thickness and the width respectively of said leg member is chosen at a value less than one, whereby the point of zerotemperature coefficient of said vibrator body is set at a temperature appearing normally within a wrist watch carried on the human body.

* * * * *